United States Patent [19]

Solomon

[11] Patent Number: 5,064,771
[45] Date of Patent: Nov. 12, 1991

[54] METHOD OF FORMING CRYSTAL ARRAY
[75] Inventor: Allen L. Solomon, Fullerton, Calif.
[73] Assignee: Grumman Aerospace Corporation, New York, N.Y.
[21] Appl. No.: 508,586
[22] Filed: Apr. 13, 1990
[51] Int. Cl.[5] .............................................. H01L 21/76
[52] U.S. Cl. ......................................... 437/3; 437/62; 437/64; 148/DIG. 50; 148/DIG. 135; 148/DIG. 85
[58] Field of Search ............................. 437/3, 62, 925; 148/DIG. 50, DIG. 135, DIG. 85

[56] References Cited
U.S. PATENT DOCUMENTS

| 3,383,760 | 5/1968 | Shwartzman | 437/62 |
| 3,433,686 | 3/1969 | Marinace | 437/62 |
| 3,834,958 | 9/1974 | Bean et al. | 148/DIG. 150 |
| 4,570,330 | 2/1986 | Cogan | 437/62 |
| 4,784,970 | 11/1988 | Solomon | 437/51 |
| 4,851,366 | 7/1989 | Blanchard | 437/64 |

FOREIGN PATENT DOCUMENTS

| 116888 | 9/1979 | Japan | 437/62 |
| 59-186345 | 4/1983 | Japan | |
| 126245 | 5/1988 | Japan | 437/62 |

Primary Examiner—Brian E. Hearn
Assistant Examiner—Linda J. Fleck
Attorney, Agent, or Firm—Stetina and Brunda

[57] ABSTRACT

A method for forming an array of single crystalline seed crystals separated by an insulator and suitable for use in the formation of infrared detector elements is disclosed. The seed crystals are formed from a single crystalline substrate having first and second planar surfaces. An array of grooves is formed in the first planar surface of the single crystalline substrate such that a plurality of protrusions are formed upon the first planar surface of the single crystalline substrate. The grooves are then filled with an insulator. A portion of the second planar surface of the substrate is then removed to expose the insulator disposed within the grooves to form an array of single crystalline seed crystals. The single crystalline seed crystals are separated by the insulator. The single crystalline seed crystals and the insulator are exposed upon both the first and second surfaces of the array.

13 Claims, 3 Drawing Sheets

METHOD OF FORMING CRYSTAL ARRAY

FIELD OF THE INVENTION

The present invention relates generally to techniques for the formation of infrared detector arrays and more particularly to a method for forming an array of single crystalline seed crystals separated by an insulator, the seed crystals suitable for use in the formation of infrared detector elements. The array may be utilized as a detector interface device to electrically and mechanically interface detector elements formed thereon to signal processing circuitry.

BACKGROUND OF THE INVENTION

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of an infrared detector is to respond to the energy of a wavelength within some particular portion of the infrared region.

All materials generate radiant energy having characteristic wavelengths within the infrared spectrum depending on the temperature of the material. Many current infrared image detection systems incorporate arrays with large numbers of discrete, highly sensitive detector elements, the electrical outputs of which are connected to signal processing circuitry. By analyzing the pattern and sequence of detector element excitations, the processing circuitry can identify and track sources of infrared radiation.

Contemporary arrays of detectors may be sized to include 256 detector elements on a side, or a total of 65,536 detectors, the size of each square detector being approximately 0.009 centimeters on a slide, with 0.00127 centimeters spacing between detectors. Such an array would therefore be 2.601 centimeters on a side. Interconnection of such a subarray to processing circuitry would require connecting each of the 65,636 detectors to processing circuitry within a square, a little more than one inch on a side. Each array may, in turn, be joined to other arrays to form an extended array that connects to 25,000,000 detectors or more. As would be expected, considerable difficulties are presented in electrically connecting the detector elements to associated circuitry.

Though the theoretical performance of such contemporary systems is satisfactory for many applications, it is difficult to construct structures that adequately interface large numbers of detector elements with associated signal processing circuitry in a practical and reliable manner. Consequently, practical applications for contemporary infrared image detector systems have necessitated further advances in the areas of miniaturization of the detector array and accompanying circuitry. Such miniaturization has necessitated improvement in the mechanical and electrical interfacing of detector element arrays to processing circuitry such as that found in Z-plane modules or that found in an array of processor circuits formed on a wafer or on an X-Y substrate surface. The connection of detector elements to associated circuitry typically involves the use of a detector interface device which provides for both the mechanical and electrical connection of a detector element array to a processor.

The outputs of detector elements typically undergo a series of processing steps in order to permit derivation of the informational content of the detector output signal. The more fundamental processing steps, such as preamplification, tuned band pass filtering, clutter and background rejection, multiplexing and noise suppression, are typically accomplished within the Z-plane module. The Z-plane module is a layered structure containing integrated circuits which perform signal processing functions on the outputs of the detector element array. The Z-plane module extends along the Z-axis, perpendicularly to the X-Y plane, i.e., the plane of the detector array. Thus, signal processing circuitry can be mounted on the focal plane, just behind the detector array, and can extend a sufficient distance in the X direction to permit the mounting of the required components.

The detector interface device must provide a thermally stable and structurally rigid interface. The structural integrity and stability of the detector interface device is crucial because of the extremely small size and density of the electrical interconnections and the brittleness of the detector seed crystalline material, such as CdTe. Very slight flexing or thermal movement of the electrical interconnections between the detector array and the processor module can damage the detector element material or overstress detector array-to-module bonds.

Contemporary detector interface devices are typically ceramic or epoxy structures which provide for the mounting of detector arrays and provide for their mechanical and electrical connection to the processor modules. The detector arrays are first installed in the detector interface device This is typically accomplished by bump bonding the detector array elements to the device and then securing the detector array in place with an epoxy. Next, the detector interface device is similarly aligned with, bump bonded to and secured to the processor module.

It would be desirable to provide a detector interface device which is an integrated structure with the detector element array. Forming the detector elements directly upon a high strength, thermally stable substrate would permit the substrate to function as a detector interface device which would be suitable for maintaining the electrical interconnection of thousands of very small, closely spaced connectors. It would also eliminate the steps of having to electrically and mechanically interface the detector elements to a separate detector interface device. This would eliminate the reliability problems associated with this interface.

As such, although the prior art has long recognized the need for structural integrity and thermal stability of a direct electrical and mechanical interconnection between infrared detector element arrays and their associated signal processing circuitry, the proposed solutions to date have been ineffective in providing a satisfactory remedy without employing an interface device.

SUMMARY OF THE INVENTION

The present invention comprises a method for forming an array of single crystalline seed crystals separated by an insulator and suitable for use in the formation of infrared detector elements. The seed crystals are formed from a single crystalline substrate having first and second planar surfaces. An array of grooves is formed in the first planar surface of the single crystalline substrate such that a plurality of protrusions are formed upon the first planar surface of the single crystalline substrate. The grooves are then filled with an insulator. A portion of the second planar surface of the substrate is then removed to expose the insulator disposed within the grooves to form an array of single crystalline seed crystals. The single crystalline seed crystals are separated by the insulator which is a material such as silicon dioxide or glass and is thermally stable and mechanically rigid. The single crystalline seed crystals and the insulator are exposed upon both the first and second surfaces of the array.

By forming detector elements directly upon a substrate having the required structural integrity and thermal stability, the prior art problems of connecting detector element arrays to associated signal processing circuitry are eliminated. These, as well as other advantages will be apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiments of the invention, and is not intended to represent the only forms in which the present invention may be constructed or utilized. The description sets forth the sequence of steps for practicing the method of the present invention in connection with the illustrated embodiments. It is to be understood, however, that the same or equivalent sequences of steps may be accomplished by different embodiments that are also intended to be encompassed within the spirit and scope of the invention.

The method of forming a crystal array of the present invention is illustrated in FIGS. 1-11 which depict two presently preferred embodiments of the invention.

Figure 1:
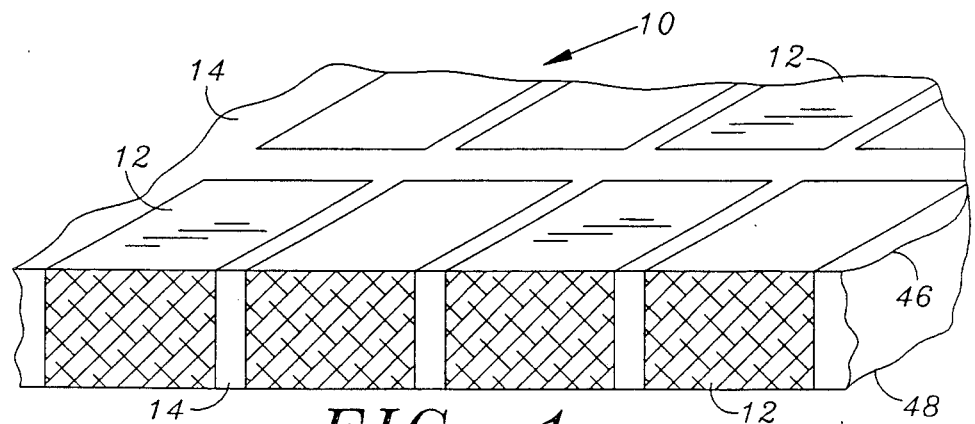
FIG. 1 is a cross-sectional perspective view of a crystal array formed by a first embodiment of the present invention.

Referring now to FIG. 1, a crystal array 10 formed according to a first embodiment of the method of the present invention is depicted. The crystal array 10 comprises individual seed crystals 12 formed in a planar array and separated from each other by an insulator 14 disposed therebetween. In the preferred embodiments the individual seed crystals 12 are illustrated represented having rectangular surfaces and cross sections. However, those skilled in the art will recognize that many geometric shapes are possible, although it is preferred that each seed crystal 12 be generally similar in shape.

Figure 2:
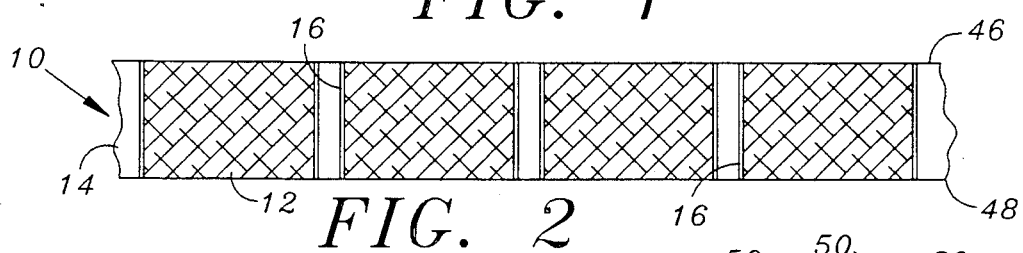
FIG. 2 is a cross-sectional perspective view of a crystal array formed by a second embodiment of the method of the present invention.

Referring now to FIG. 2, a crystal array 10 formed by the method of the second embodiment of the present invention is depicted. The crystal array 10 formed by the second embodiment of the method has individual seed crystals 12 and insulator 14 as in the first embodiment and differs from the first embodiment only in the addition of conductive film 16 formed intermediate the individual seed crystals 12 and insulator 14.

The conductive film 16 provides a electrical grid when interconnected upon one surface of the array. The electrical grid can operate to interconnect common photodetector electrodes as is common in the art, thus forming a common conductor for all photosensitive detector elements.

Figure 3:
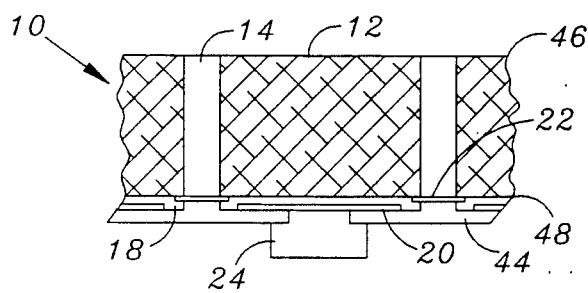
FIG. 3 is an enlarged cross-sectional view of the crystal array of FIG. 1 having detector elements and conductive bumps formed upon the lower surface thereof.

Referring now to FIG. 3, photosensitive detector elements comprised of a photosensitive conductor material of a first type 18 and a photosensitive semiconductor material of a second type 20 are depicted formed upon the lower surface 48 of seed crystal 12. A conductive grid 22 has also been formed upon the lower surface of the array to interconnect a common photosensitive detector element electrode, i.e., the photosensitive detector element semiconductor material of a first type 18. That is, the conductive grid forms the common, ground, or return conductor for the array of detector elements.

Conductive bumps 24 have been formed upon the photosensitive semiconductor material of a second type 20 of each photosensitive detector elements to provide electrical interconnection of each photosensitive detector element to external circuitry. An insulator 44 prevents contact of the conductive bump 24 to the photosensitive semiconductor material of a first type 18.

Figure 4:
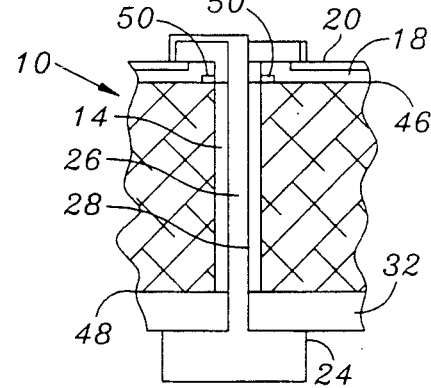
FIG. 4 is an enlarged view of the crystal array of FIG. 2 having detector elements formed upon the upper surface thereof and conductive bumps formed upon the lower surface thereof and conductive conduits connecting the detector elements to the conductive bumps.

FIG. 4 depicts the seed crystal array of FIG. 1 having photosensitive semiconductor elements comprising photosensitive semiconductor material of a first type 18 and photosensitive semiconductor material of a second type 20 formed upon the upper surface 46 thereof. Conductive bumps 24 are formed upon the lower surface 48 of the crystal array to connect the photosensitive detector elements to external processing circuitry. Conductive conduits 26 formed within vias 28 provide electrical connection between the photosensitive semiconductor material of a second type 20 and the conductive bumps 24.

A conductive grid 50 formed upon the upper surface 46 of the seed crystal array 10 electrically interconnects each detector's photosensitive semiconductor material of a first type 18. The conductive grid 50 thereby provides a common conductor which may be electrically connected to a conductive bump (not shown) formed upon the lower surface of the seed crystal array in a manner similar to that depicted in FIG. 4. That is, the conductive grid 50 may 0 be connected to a conductive bump 24 using a conductive conduit 26 and via 28 as was done to connect detector elements formed upon the upper surface 46 to conductive bumps formed upon the lower surface 48.

Referring now to FIGS. 5-11, the two preferred embodiments of the method of the present invention are illustrated.

Figure 5:
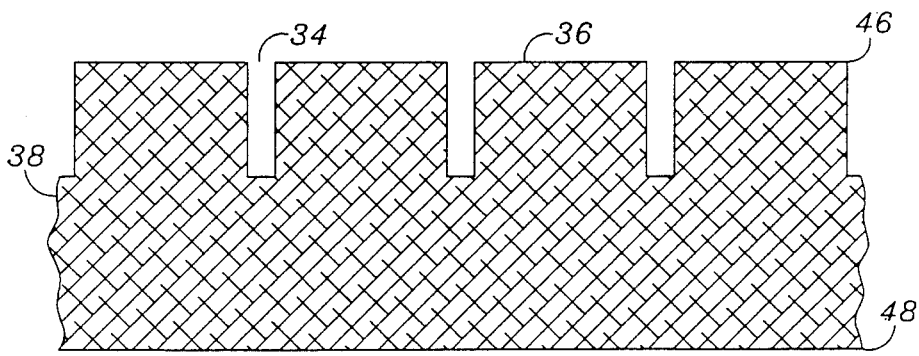
FIG. 5 is a cross-sectional side view of a first substrate having grooves formed therein according to both the first and second embodiments of the method of the present invention.

With particular reference to FIG. 5, a first substrate 38 has grooves 34 formed upon its upper or first surface 46, thus forming protrusions 36 according to both the first and second embodiments of the present invention. The protrusions 36 will ultimately become the individual seed crystals 12 of the completed seed crystal array 10.

The grooves 34 can be formed by well-known processes such as reactive ion etching, ion milling, or laser drilling.

The step of forming the grooves 34 upon the upper surface of the substrate 38 is common to both the first and second embodiments of the method of the present invention. No particular distinction is made between the grooves 34 of the first and second embodiments.

Figure 6:
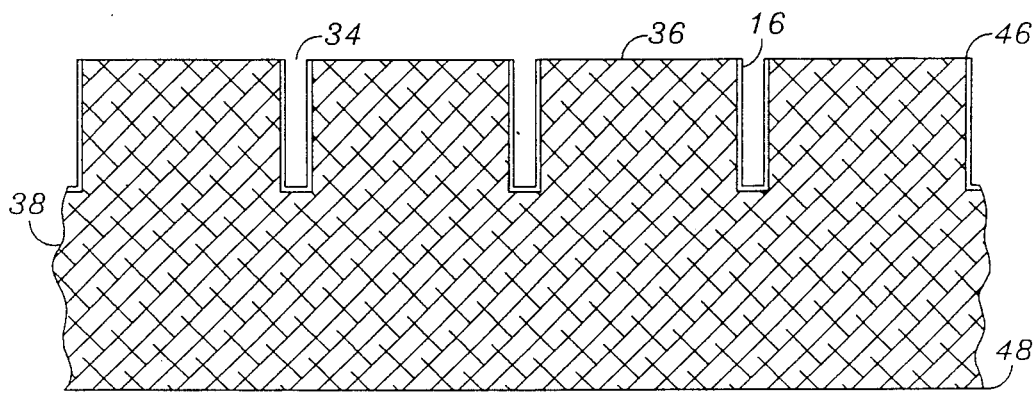
FIG. 6 is a cross-sectional side view of the first substrate of FIG. 5 having a thin conductive film formed within grooves according to the second embodiment of the method of the present invention.

With particular reference to FIG. 6, the second embodiment of the method of the present invention adds the step of depositing a thin conductive layer or film 16 within each groove 34. This layer of conductive film 16 improves the adhesion of the single crystalline substrate material 38 to the insulator 14 which is to be subsequently deposited in the grooves 34.

Figure 7:
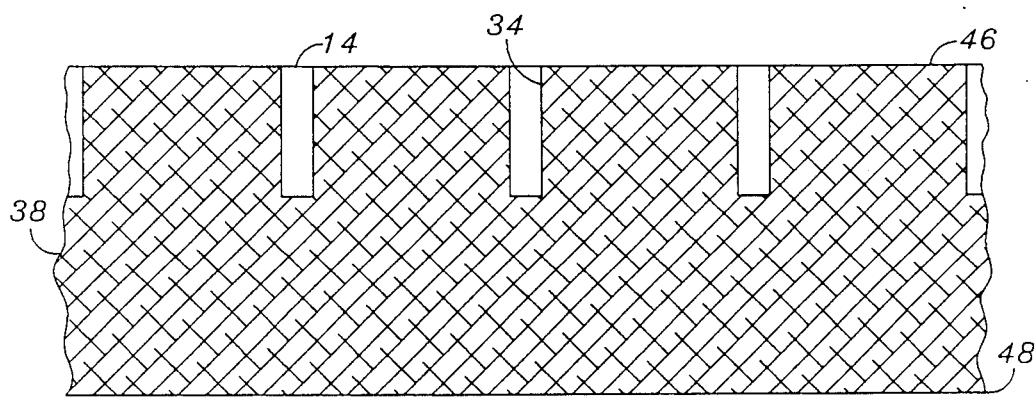
FIG. 7 is a cross-sectional side view of the first substrate of FIG. 5 having the grooves filled with an insulator according to the first embodiment of the present invention.

With particular reference to FIG. 7, an insulator 14 has been deposited within the grooves 34 according to the first embodiment of the method of the present invention. The insulator 14 can be deposited within the grooves 34 by chemical vapor deposition. Insulating materials such as silicon dioxide or glass are suitable. The insulator 14 must be capable of withstanding the temperatures required for subsequent epitaxial growth of photosensitive detector elements upon the seed crystals 12 formed by the methods of the present invention.

Figure 8:
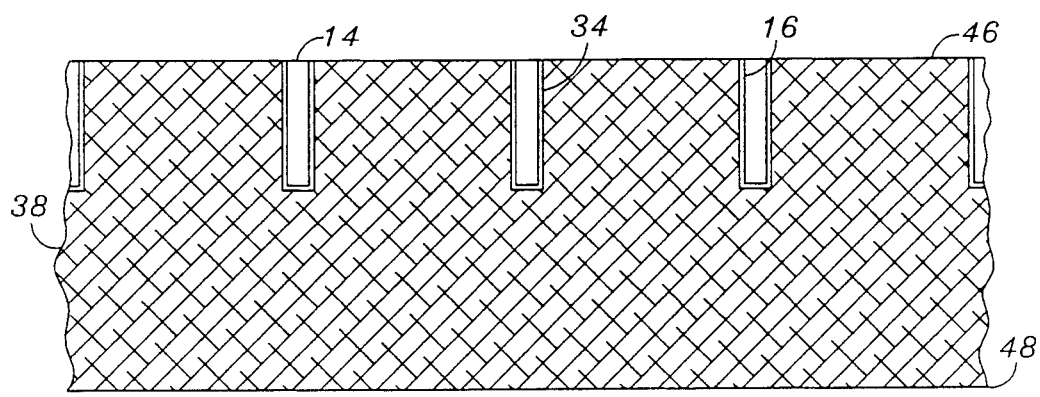
FIG. 8 is a cross-sectional side view of the first substrate of FIG. 6 having the grooves filled with an insulator according to the second embodiment of the present invention.

With particular reference to FIG. 8, an insulator 14 is disposed within the grooves 34 according to the second embodiment of the present invention. The insulator 14 is formed directly upon the conductive film 16.

Figure 9:
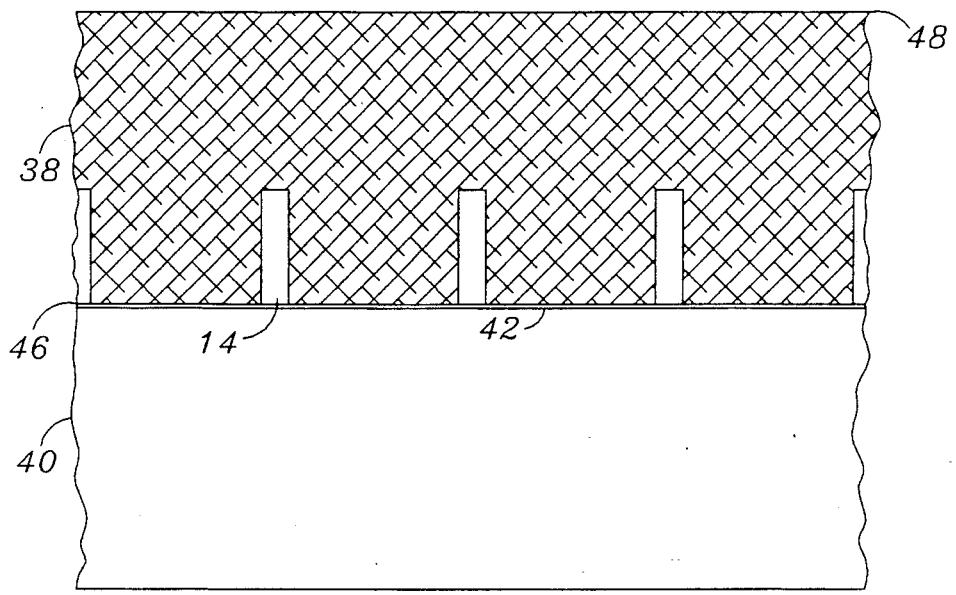
FIG. 9 is a cross-sectional side view of the first substrate of FIG. 7 showing the substrate inverted and attached to a second substrate according to the method of the first embodiment of the present invention.

With particular reference to FIG. 9, the first substrate 38 may be inverted and a second substrate 40 may be temporarily attached to the first substrate 38 with an adhesive 42 such that the ungrooved or second surface 48 of the first substrate 38 is exposed. The second substrate 40 facilitates handling of the very thin, delicate, and brittle single crystalline first substrate 38.

Figure 10:
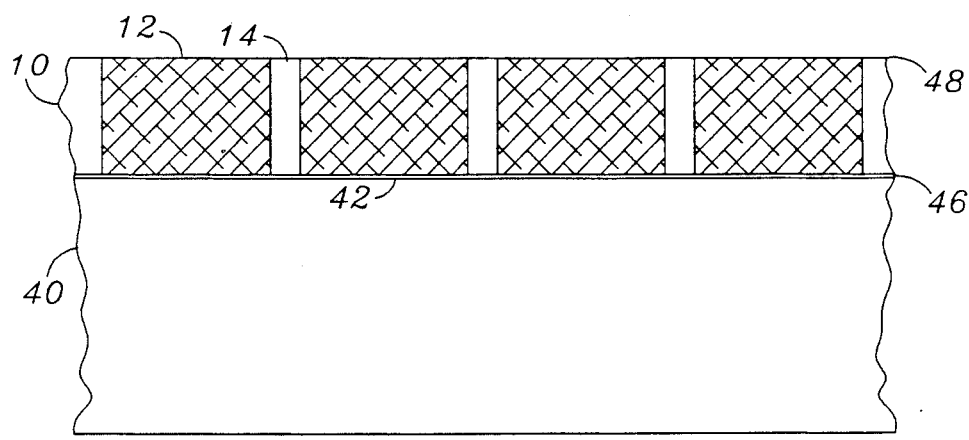
FIG. 10 is a cross-sectional side view of the first and second substrates of FIG. 9 after the first substrate has been ablated according to the method of the first embodiment of the present invention.
Figure 11:
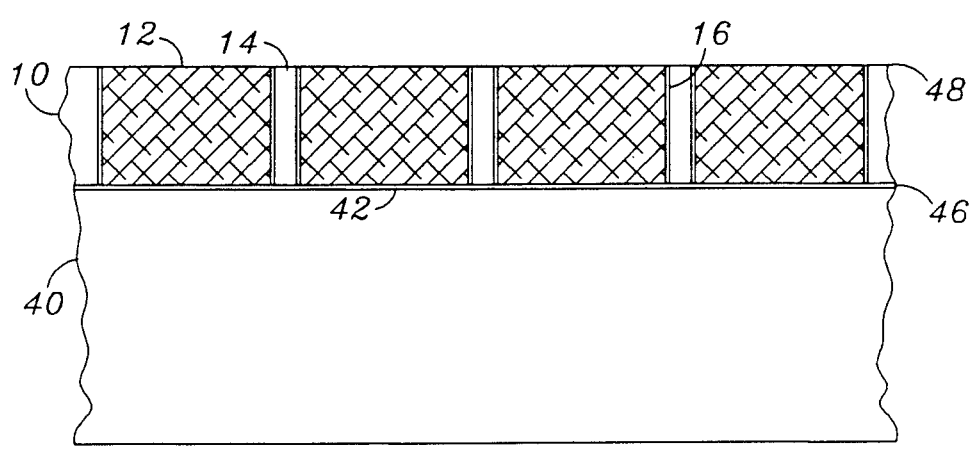
FIG. 11 is a cross-sectional side view of the first and second substrates after the first substrate has been ablated according to the method of the second embodiment of the present invention.

With particular reference to FIGS. 10 and 11, the second surface 48 of the first substrate 38 is ablated sufficiently to expose the insulator 14 such that both the insulator 14 and single crystalline material 12 will be exposed upon both the first 46 and second 48 surfaces of the completed crystal array 10. This step is performed in both the first and second embodiments of the method of the present invention. The first substrate 38 may be ablated by methods well known in the art such as grinding, etching, or lapping.

The second substrate 40 is removed from the ablated first substrate 38 to provide the crystal arrays 10 formed by the first and second embodiments of the method of the present invention depicted in FIGS. 1 and 2 respectively. The second substrate 40 may remain bonded to the first substrate 38 to facilitate handling during the subsequent detector array fabrication process.

Photosensitive detector elements are formed upon the individual seed crystals 12 using methods well known in the art. For example, a photosensitive semiconductor material of a first type, e.g. p-type, may be formed directly upon one surface of the seed crystal 12 by conventional epitaxial growth. A photosensitive semiconductor material of a second type, e.g. n-type, may then be formed by either diffusion or epitaxial growth upon the photosensitive semiconductor material of a first type, thus forming a photosensitive detector element. Conductive grids 22 and 46 as well as insulating layers 44 and 32 (FIGS. 3 and 4) may then be formed upon the crystal array to interconnect and insulate the photosensitive detector elements.

Conductive bumps 24 may then be formed upon either the same surface (FIG. 3) or opposite surface (FIG. 4) of the crystal array to provide electrical interconnection of the photosensitive detector elements to external signal processing circuitry.

A photosensitive detector element array thus formed will have greater structural integrity and mechanical rigidity as well as better thermal stability than photosensitive detector element array formed directly upon a monolithic single crystalline substrate and attached to a contemporary detector interface device. Thus, the crystal array formed by the method of the present invention is suitable for use as a detector interface device for electrically and mechanically interfacing detector elements to external signal processing circuitry such as that as commonly found in Z-plane modules.

It is understood that the exemplary methods described herein and shown in the drawings represent only presently preferred embodiments of the invention. Indeed, various modifications and additions may be made to such embodiments without departing from the spirit and scope of the invention. For example, the shapes and configuration of the individual seed crystals 12 need not be as depicted. It is recognized that other shapes and configurations are equally suitable. Thus, these and other modifications and additions may be obvious to those skilled in the art and may be implemented to adapt the present invention for use in a variety of applications.

What is claimed is:

1. A method for forming an array of single crystalline seed crystals separated by an insulator, the seed crystals being formed from a single crystalline first CdTe substrate having first and second surfaces, the method comprising:

(a) forming an array of grooves in the first surface of the single crystalline first CdTe substrate, the array of grooves defining a plurality of protrusions upon the first surface of the single crystalline first substrate;

(b) filling the grooves with the insulator; and (c) removing a sufficient portion of the second surface of the first CdTe substrate to expose the insulator disposed within the grooves;

(d) wherein the step of removing a portion of the second surface results in the formation of an array of single crystalline seed crystals separated by the insulator, the single crystalline seed crystals and the insulator being exposed upon both the first and second surfaces of the array.

2. The method as recited in claim 1 further comprising the step of removably attaching the first surface of the first CdTe substrate to a second substrate to facilitate handling of the first substrate.

3. The method as recited in claim 2 further comprising the step of forming photosensitive detector elements upon the seed crystals.

4. The method as recited in claim 3 further comprising the step of forming a conductive grid interconnecting a common electrode of the photosensitive detector elements.

5. The method as recited in claim 4 wherein the step of filling the grooves with the insulator comprises filling the grooves with silicon dioxide.

6. The method as recited in claim 4 wherein the step of filling the grooves with the insulator comprises filling the grooves with glass.

7. A method for forming an array of single crystalline seed crystals separated by an insulator, the seed crystals being formed from a single crystalline first substrate having first and second surfaces, the method comprising:

(a) forming an array of grooves in the first surface of the single crystalline first substrate, the array of grooves defining a plurality of protrusions upon the first surface of the single crystalline first substrate;

(b) forming a conductive layer within the grooves formed in the first surface of the single crystalline substrate;

(c) filling the grooves with the insulator: and (d) removing a sufficient portion of the second surface of the first substrate to expose the insulator disposed within the grooves;

(e) wherein the step of removing a portion of the second surface results in the formation of an array of single crystalline seed crystals separated by the insulator, the single crystalline seed crystals and the insulator being exposed upon both the first and second surfaces of the array.

8. The method as recited in claim 7 further comprising the step of removably attaching the grooved first surface of the first substrate to a second substrate to facilitate handling of the first substrate.

9. The method as recited in claim 8 further comprising the step of forming photosensitive detector elements upon the seed crystals.

10. The method as recited in claim 9 further comprising the step of forming a conductive grid interconnecting a common electrode of the photosensitive detector elements.

11. The method as recited in claim 10 wherein the step of forming an array of grooves in the first surface of the single crystalline substrate comprises forming an array of grooves in the first surface of a CdTe first substrate.

12. The method as recited in claim 11 wherein the step of filling the grooves with the insulator comprises filling the grooves with silicon dioxide.

13. The method as recited in claim 11 wherein the step of filling the grooves with the insulator comprises filling the grooves with glass.

* * * * *